United States Patent [19]

Coldren et al.

[11] Patent Number: 4,874,459
[45] Date of Patent: Oct. 17, 1989

[54] LOW DAMAGE-PRODUCING, ANISOTROPIC, CHEMICALLY ENHANCED ETCHING METHOD AND APPARATUS

[75] Inventors: Larry A. Coldren, Santa Barbara; Jay A. Skidmore, Goleta, both of Calif.

[73] Assignee: The Regents of the University of California, Berkeley, Calif.

[21] Appl. No.: 258,646

[22] Filed: Oct. 17, 1988

[51] Int. Cl.⁴ ..................... H01L 21/306; B44C 1/22; C03C 15/00; C03C 25/06
[52] U.S. Cl. .................................... 156/643; 156/345; 156/646; 156/662; 204/192.35; 204/298
[58] Field of Search ............... 156/345, 643, 646, 654, 156/655, 662; 204/192.34, 192.35, 192.37, 298 BE; 219/121.33, 121.51, 121.55, 121.84; 250/492.3

[56] References Cited

U.S. PATENT DOCUMENTS 4,541,890  9/1985  Cuomo et al. ................. 156/345
4,639,301  1/1987  Doherty et al. ........... 204/192.34 X
4,734,158  3/1988  Gillis ....................... 204/298 BE
4,750,979  6/1988  Gee et al. ................ 204/192.34 X
4,756,794  7/1988  Yoder ........................ 156/345 X Primary Examiner—William A. Powell
Attorney, Agent, or Firm—Donald A. Streck

[57] ABSTRACT

Anisotropic chemically enhanced etching apparatus producing extremely low surface damage during the etching process. There is an evacuated main chamber in which an etching process takes place. A temperature-controlled, tiltable stage receives and holds the substrate to be etched within the main chamber. There is a nozzle directing a flow against a substrate mounted on the stage. There is a microwave cracker connected to a supply of molecular chlorine on an input side and connected to the nozzle on an output side for exciting and disassociating the molecular chlorine to be discharged through the nozzle as chlorine radicals. A first controller is operably connected to the cracker for controlling the flow of chlorine radicals being emitted from the nozzle. There is an ion gun for controlling the beam of ions. The second controller includes a feedback signal.

40 Claims, 4 Drawing Sheets

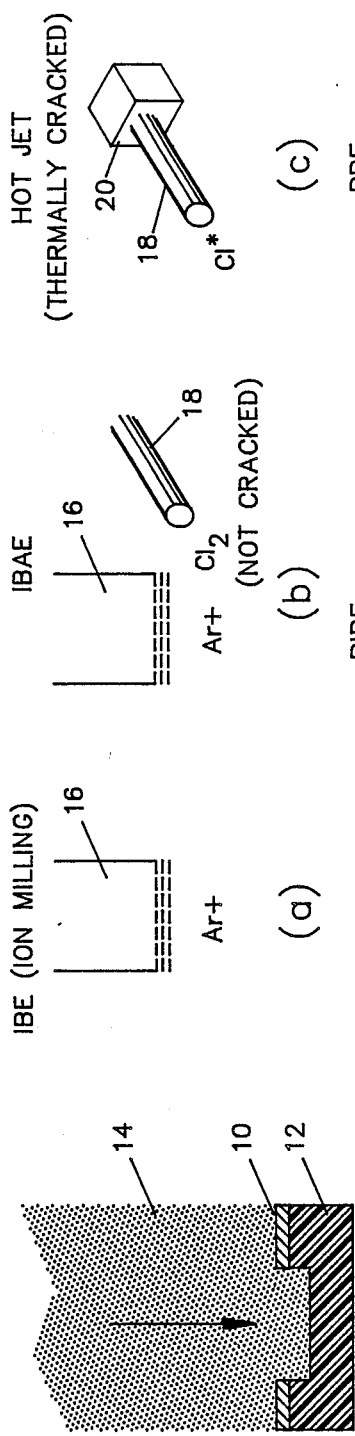
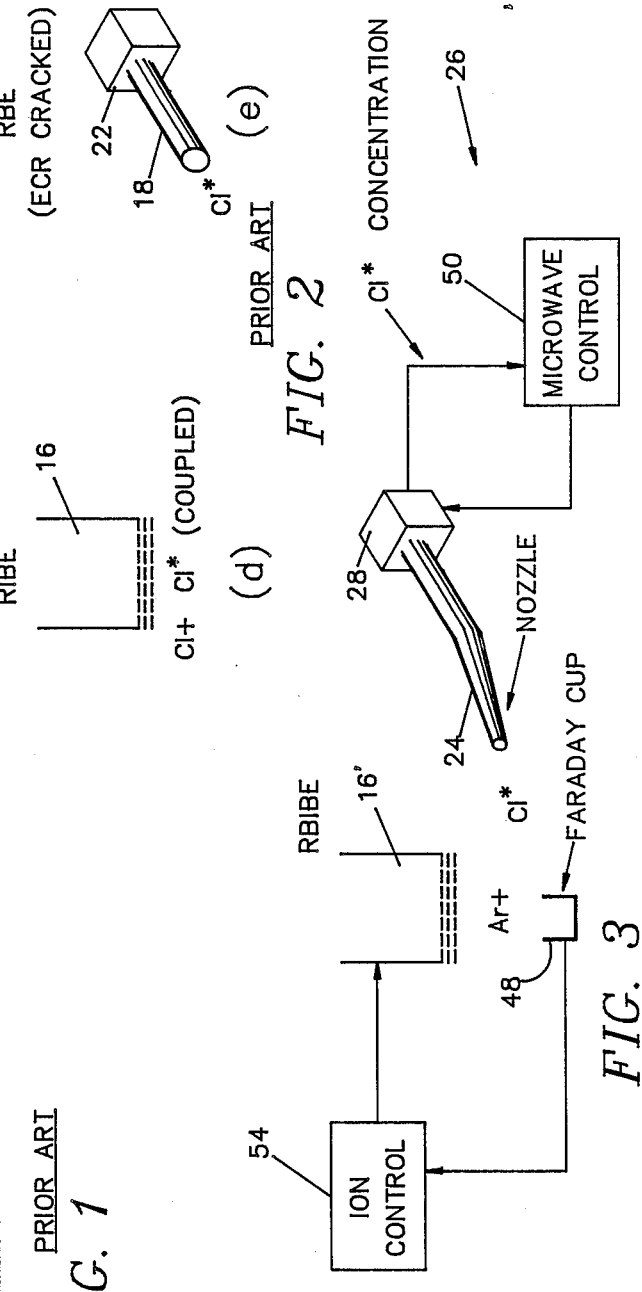

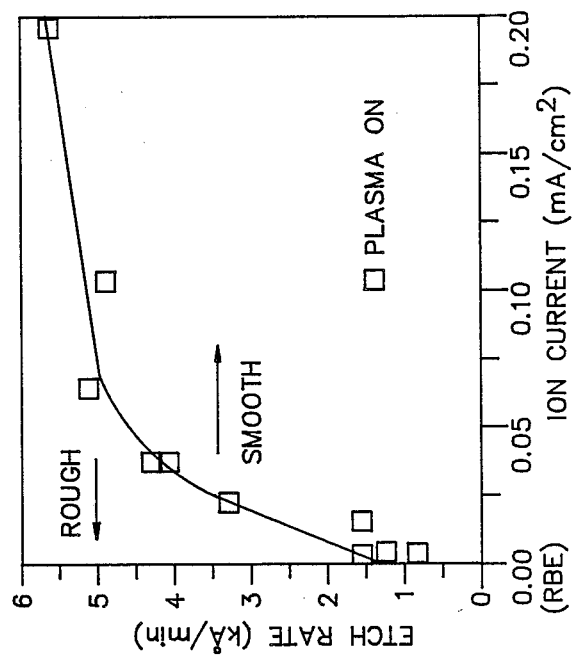
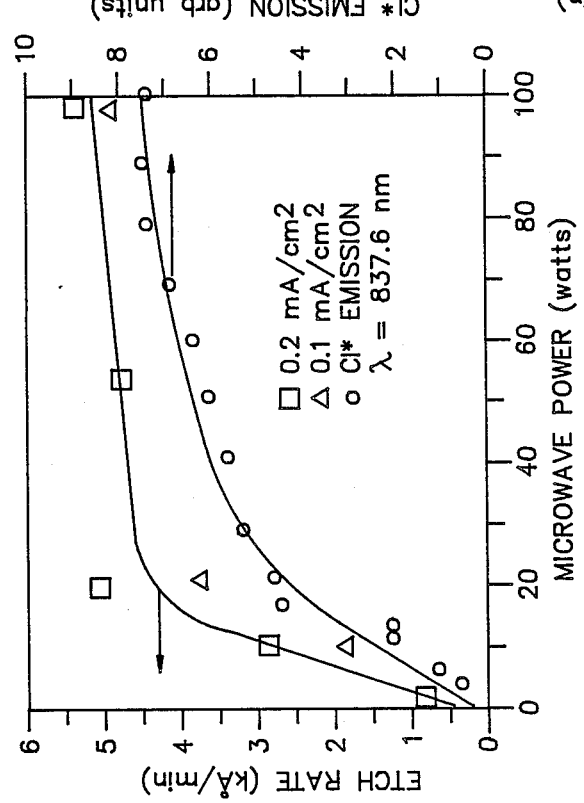
FIG. 9
FIG. 8

LOW DAMAGE-PRODUCING, ANISOTROPIC, CHEMICALLY ENHANCED ETCHING METHOD AND APPARATUS

BACKGROUND OF THE INVENTION

The present invention relates to methods and apparatus for dry etching GaAs, and the like, and, more particularly, to anisotropic chemically enhanced etching apparatus characterized by its ability to produce low damage in the surface being etched and comprising, an evacuated main chamber in which an etching process takes place; a stage for receiving and holding a substrate to be etched within the main chamber; duct means for directing a flow into the main chamber and against a substrate to be etched mounted on the stage; cracking means connected to a supply of molecular chlorine on an input side and connected to the duct means on an output side for exciting and disassociating the molecular chlorine to be discharged through the duct means; first control means operably connected to the cracking means for controlling the level of $\mu W$ power into the cracking means and the flow of molecular chlorine into the cracking means whereby the chlorine radicals being emitted from the duct means are controlled; ion gun means for producing a beam of ions and for directing the beam of ions against a substrate to be etched mounted on the stage; and, second control means operably connected to the ion gun means for controlling the beam of ions.

Dry etching has gained popularity in recent years for the fabrication of Sielectronics and optoelectronic devices in the III–V compounds. These dry etching processes as applied to these particular uses have been developed primarily over the past decade. Despite many approaches having been taken by those skilled in the art as the art has developed to its present state, damage to the surface of the material being etched still remains as a major problem.

Sputter-etching or ion-milling has been used over an even longer period of time, and it still enjoys some use today, although many in the art have turned to some sort of reactive dry etching process in an attempt to reduce damage, increase anisotropy, reduce mask erosion, and achieve deeper etched features. As depicted in simplified form in FIG. 1, the intent is a common one. A mask 10 defining a pattern to be achieved is placed over a substrate 12 to be etched with the pattern. An etching beam 14 of some type is then directed against the mask 10 and exposed areas of the substrate 12. The beam 14 is stopped by the mask 10 thereby causing the exposed areas of the substrate 12 to be removed by the etching action of the beam 14. As will be discussed in greater detail shortly with respect to the examples thereof depicted in FIG. 2, the "beam" 14 may comprise a stream which physically attacks the substrate 12, a stream which chemically attacks the substrate 12, or a combination of the two. For example, as shown in FIG. 2(a), in Ion Beam Etching (IBE) a stream of $Ar^+$ ions from an ion gun 16 are directed against the substrate and the incident ions striking the substrate physically "mill" the material away on an atomic level; that is, the ions dislodge atoms of the substrate material in much the same way as a sandblasting gun would dislodge material on a larger scale.

The first reactive etching of III–Vs was done at AT&T Bell Laboratories about ten years ago. Integrated optics were, and remain, a key application of this kind of etching, although it has since been applied to numerous electronic circuits as well. In fact, integrated optics is an increasing field of use which is constantly pushing the art to its maximum as uses thereof are recognized. For example, in the growing field of optical computing, requirements of the total technique require the ability to form diode lasers as part of the overall computer structure and its interconnections on a single chip. As can be appreciated, such integrated optics must be highly accurate (to "aim" the laser beam produced from stage to stage on the circuit) and must have highly polished and minimally damaged surfaces associated therewith to minimize optical losses which could make the circuitry inoperative.

The first reactive etching efforts relative to optoelectronics made use of $Cl_2$-$O_2$-Ar gas mixtures for the construction of laser facets and narrow etched grooves to create coupled-cavity laser structures. Shortly after the first lasers with such Reactive Ion Etched (RIE) facets were reported, the first Reactive Ion Beam Etching (RIBE), as depicted in FIG. 2(d), was demonstrated. In both RIE and RIBE, chlorine ions are accelerated in a straight line to the substrate surface. The substrate is also assumed to be covered by an adsorbed layer of chlorine. The combination of incident ions and the adsorbed molecules result in a chemical reaction between the III–V and chlorine atoms. The reaction products are also sputtered away by the incident ions. Thus, etching occurs only along the path of the ions. With RIBE, the substrate is in a separate chamber from where the ions are generated and accelerated. Thus, angled walls (i.e. "facets") are easily created. Other prior art work has shown that this angled etching can also be accomplished in an RIE system if the substrate is enclosed in a Faraday cage.

The above-described etching work formed the basis of what is probably the most successful and widely publicized use of dry etching for optoelectronic device to date—the RIBE dry etching work of Asakawa et al. at the Optoelectronics Joint Research Laboratory. This apparatus included an Electron-Cyclotron-Resonance (ECR) microwave plasma source and surface-analysis equipment in an ultra-high vacuum system. The ECR source is an efficient and reliable method of generating plasmas in reactive gases. It also creates a higher percentage of reactive species which enhance the etching. The analysis equipment allowed the evaluation of the amount of surface damage as a function of various etching parameters for the first time. This lead to a recent report of the finding that the higher the sputter yield (number of etched atoms per incident atom), the less the damage for a fixed ion energy.

Some time before the above-described work of Asakawa et al. was begun, Geis et al. at MIT Lincoln Labs demonstrated an Ion Beam Assisted Etching (IBAE) process, as depicted in FIG. 2(b), in which chlorine was separately admitted to the chamber of an ion mill through a pipe 18, rather than directly into the ion gun 16 as in the RIBE approach. In this case, the $Cl_2$ molecules are adsorbed to the substrate surface, and the etching is promoted by the incident $Ar^+$ ions. It is thought that these ions perform two functions. First, that they stimulate the chemical reaction. Second, that they bombard away the reaction products. A little later, the same group also demonstrated a so-called "hot-jet" etching technique (see FIG. 2(c)) in which the chlorine was cracked in a small high temperature oven 20 as it entered the etching chamber. In this process there is a key difference. The chemical reaction takes place without the need for the high-energy ions since the chlorine is already cracked into its more reactive atomic form. Although spontaneous etching occurred at room temperature, by heating the substrate, the group found that the etching was enhanced since the reaction products were made more volatile. The Ar+ ion beam was necessary to clean the substrate initially, and it also could be used to etch away the reaction products. In a similar approach, Asakawa has also reported the use of microwave ECR 22 without an accelerating field in Radical Beam Etching (RBE), as shown in FIG. 2(e). In this case, chlorine gas molecules are cracked and excited to higher electronic states as they enter the vacuum system as in hot-jet etching as described above. The low-energy, highly-reactive species then react spontaneously with the III-V substrate; and, if the temperature is sufficiently high, the reaction products are volatilized and pumped away. This so-called "radical beam" etching provides crystallographic etching very much like wet etching. From a comparison of these prior art approaches, it appears that the ECR microwave source may be a more practical way to create the cracking and excitation of chlorine molecules in an etching process utilizing them.

As described above, a number of techniques have been proposed to create reactive etching species. The hot-jet etching technique of FIG. 2(c) has been demonstrated to etch GaAs spontaneously without the need for ion bombardment. In that case, the $Cl_2$ gas is thermally disassociated into atomic radicals in a small tube furnace before it reaches the substrate. The $Cl_2$ appears to be "cracked" most efficiently into atomic radicals (Cl*) by employing an Electron Cyclotron Resonance (ECR) plasma such as in the Radical Beam Etching (RBE) process of FIG. 2(e). Also, the ECR cracker is more controllable, more clean, and more reliable. If the substrate is heated, nonvolatile etch products are more effectively desorbed to provide surface cleaning and crystallographic etching. If the etch products are removed by ion bombardment instead as in the Reactive Ion Beam Etching (RIBE) process of FIG. 2(d), then the wall angle is determined by the ion beam direction, making anisotropic etching possible. In this technique, the ion source (i.e. ion gun 16) supplies the ions (Cl+) as well as the reactive flux (Cl*) so the physical and chemical components are coupled together; thus, control over the degree of chemical enhancement is difficult. The Ion Beam Assisted Etching (IBAE) approach of FIG. 2(b) offers some independent control of the chemical and physical components by delivering the etch gas to the sample separately from the ion beam; however, the degree of chemical etching is somewhat limited because the etch gas is not plasma excited and is relatively unreactive. Even more recently, Magnetron-plasma Ion Beam Etching (MIBE), not shown, was developed to allow for the decoupling of the chemical etch component from the ionic component. The neutral reactive species were obtained by Magnetron reactive Ion Etching (MIE) and the ion species were generated by an ion beam souce; however, as in RIE, there is still a physical component in the absence of the ion beam due to the presence of the dc self-bias ($\sim 50$ eV).

Wherefore, it is the object of the present invention to provide a method and associated apparatus for dry etching based on a modified IBAE approach in which the etch gas ($Cl_2$) is cracked into radicals in a microwave discharge and delivered in high concentrations to the etching stage through an adjacent nozzle independently from the Ar+ ion beam.

It is another object of the present invention to provide a method and associated apparatus for dry etching based on a modified IBAE approach which provides separate control of the radical flux and the ion flux.

It is still another object of the present invention to provide a method and associated apparatus for dry etching based on a modified IBAE approach which enables the degree of anisotropy and chemical enhancement to be varied over the widest possible range.

It is yet another object of the present invention to provide microwave apparatus in which the etch gas ($Cl_2$) is cracked into radicals in a microwave discharge in an optimum and cost effective manner and which minimizes recombination of the radicals into atoms prior to the etching site.

It is still a further object of the present invention to provide a method and associated apparatus for dry etching in which the surface being etched is subjected to a minimum degree of damage by the etching process.

Other objects and benefits of the present invention will become apparent from the description which follows hereinafter when taken in combination with the drawing figures which accompany it.

SUMMARY

The foregoing objects have been achieved by the anisotropic chemically enhanced etching apparatus of the present invention comprising, an evacuated main chamber in which an etching process takes place; a stage for receiving and holding a substrate to be etched within the main chamber; duct means for directing a flow into the main chamber against a substrate to be etched mounted on the stage; cracking means connected to a supply of molecular chlorine on an input side and connected to the duct means on an output side for exciting and disassociating the molecular chlorine to be discharged through the duct means as chlorine radicals; ion gun means for producing a beam of ions and for directing the beam of ions against a substrate to be etched mounted on the stage; and first control means operably connected to the ion gun means for controlling the beam of ions.

The preferred embodiment additionally comprises the main chamber including load-locking means for suppressing residual gas contamination and an associated preparation chamber for the introduction of a substrate to be etched into the main chamber. Additionally in the preferred embodiment, the duct means includes nozzle means positioned such that in the vicinity of the substrate being etched the nozzle means produces a concentrated stream of chlorine radicals that can be absorbed to the substrate.

The preferred embodiment also includes second control means operably connected to the cracking means for controlling the $\mu W$ power to the cracking means and the flow of molecular chlorine into the cracking means whereby the flow of chlorine radicals being emitted from the nozzle means is controlled. The preferred first control means comprises control circuit means for controlling the operating parameters of the ion gun means and ion sensor means disposed within the main chamber and operably connected to the control circuit means for sensing the qualities of the beam of ions striking a substrate mounted on the stage and for providing a feedback signal reflecting those qualities to the control circuit means. The preferred cracking means comprises a microwave cavity wherein, the microwave cavity has quartz inlet and outlet pipes connected therethrough; the inlet pipe is connected to the supply of molecular chlorine; and, the microwave cavity is sandwiched between a pair of annular Samarium Cobalt magnets disposed over the inlet and outlet pipes, respectively, to produce an axial magnetic field that confines plasma from the quartz inner walls of the pipes so that the recombinatorial enhancing effect of the quartz on chlorine radicals passing therethrough is minimized.

DESCRIPTION OF THE DRAWINGS:

FIG. 1 and FIG. 1(a)–(e) are simplified drawings showing the general prior art approach to dry etching.

FIG. 2 is a simplified representation of various combinations of physical and chemical dry etching known in the art.

FIG. 3 is a simplified drawing of the apparatus employed in the present invention for dry etching.

FIG. 8 is a graph of etch rate and chlorine emission intensity as a function of microwave power. The chlorine flow rate is 9 sccm. The Ar+ ion energy is 200 eV.

FIG. 9 is a graph of etch rate as a function of ion beam current density. The chlorine flow rate is 9 sccm. The Ar+ ion energy is 200 eV.

DESCRIPTION OF THE PREFERRED EMBODIMENT:

As depicted in simplified form in FIG. 3, the present invention comprises a novel Radial Beam and Ion Beam Etching (RBIBE) technique and associated apparatus employing a microwave-excited radical beam nozzle 24 and an ion beam gun 16 which has been demonstrated in repeated tests to provide smooth and rapid etching of GaAs structures. As will be described, there is separate control of both argon ion (Ar+) energy and/or current and chlorine radical (Cl*) beam flux density which has enabled the inventors to realize highly chemically enhanced GaAs etching. The RBIBE technique of the present invention differs qualitatively and offers greater flexibility than prior art Reactive Ion Etching (RIE), Ion Beam Assisted Etching (IBAE, where no reactive gas plasma is excited), or Reactive Ion Beam Etching (RIBE, where independent control of radical and ion beam flux is difficult). Novel apparatus for cracking the Cl$_2$ gas molecules to create the chlorine radical (Cl*) beam in an optimum manner and resistant to recombination is also employed.

Figure 6:
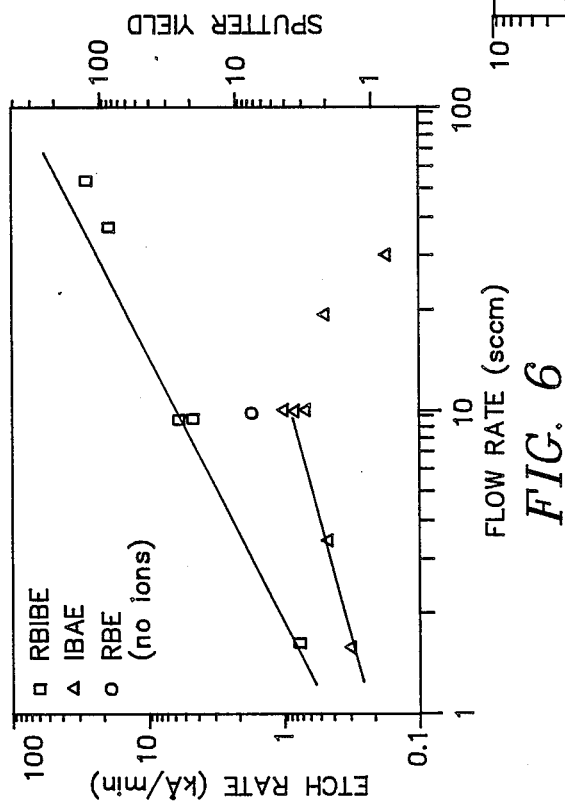
FIG. 6 is a graph of etch rate and sputter yield of IBAE (plasma off), RBIBE (plasma on) as a function of chlorine flow rate. RBE (plasma on, no ion beam) is shown for comparison. The temperature is 30° C.

In this system, the separate nozzle 24 generates a locally high chlorine radical flux density while separate control of ion beam parameters is maintained. Etch rate was examined as a function of temperature, flow rate, and microwave power. The inventors observed that as the concentration of chlorine radicals is increased, either by increasing the flow rate or the microwave power, the etch rate increases. Because of the large flux achieved through the separate nozzle 24 as mentioned above, high etch rates in the order of 2.5 μm/min have been realized using low ion energies (200 eV) at room temperature. This corresponds to a sputtering yield of approximately 150; which, to the inventors' knowledge, is the highest reported to date. Furthermore, the sputtering yield is typically ten times greater with chlorine radicals than with chlorine molecules. Optical emission spectroscopy is used to correlate the etch rate with the concentration of chlorine radicals in the microwave cavity. Results comparing etch rate versus temperature for the cases with the microwave source on and off are shown in FIG. 6. From the results achieved in testing to date, the inventors anticipate that this new highly chemically enhanced etching of the present invention will be particularly useful for smooth and low damage microfabrication of optoelectronic integrated circuits, such as the production of vertical mirror facets. An advantage of having independent control of ion beam parameters (ion energy and current) and chlorine radical beam flux density is the ability to control the degree of chemical enhancement and anisotropy—which has heretofore be virtually impossible to any meaningful degree.

Figure 5:
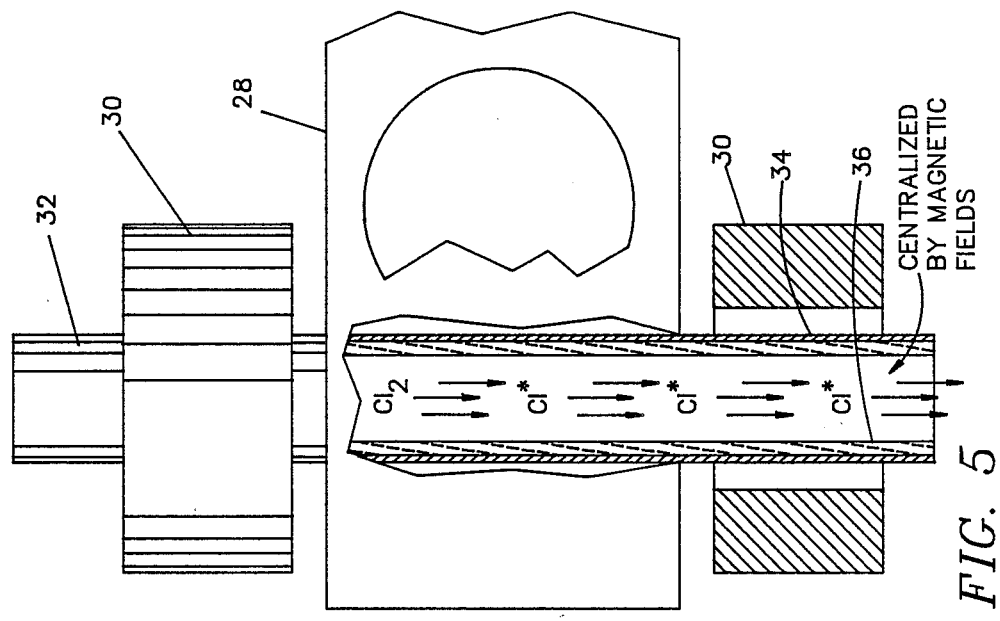
FIG. 5 is an enlarged, partially cutaway drawing of the cracking apparatus employed in the preferred embodiment of the present invention.
Figure 4:
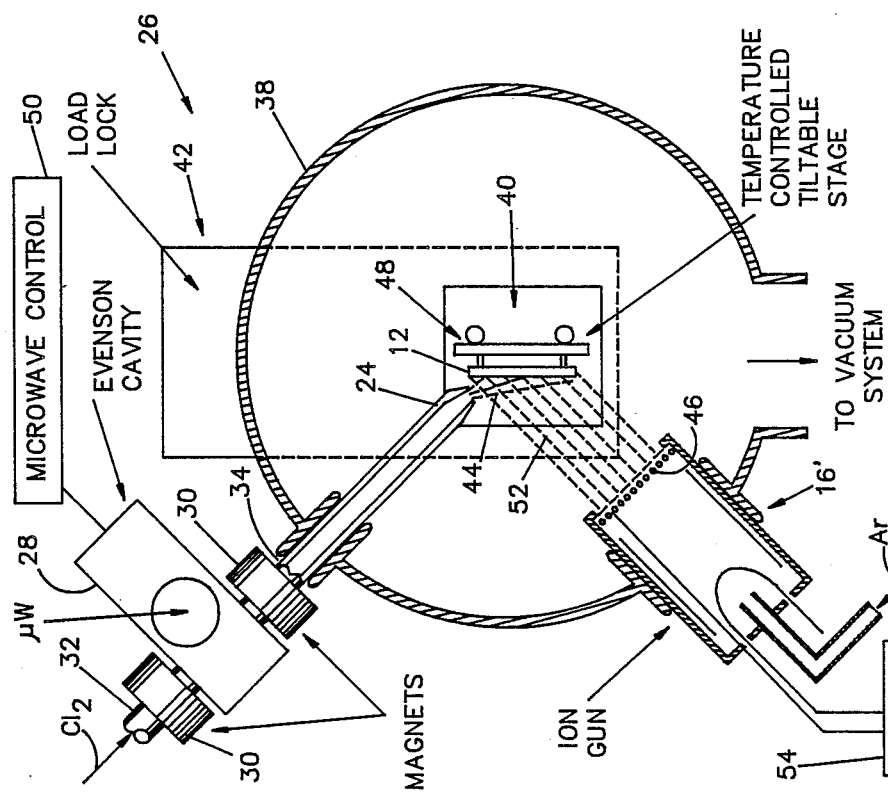
FIG. 4 is a detailed, partially cutaway, top view drawing of an etching chamber constructed according to the present invention.

As shown with specificity in FIGS. 4 and 5, the etching system of the present invention, generally indicated as 26, employs many components typical of the prior art etching systems described above. The etching takes place within an evacuated main chamber 38 that is loadlocked to suppress residual gas contamination. The substrate 12 to be etched is mounted to a temperature controlled tiltable stage 40 in a preparation chamber (not shown for simplicity) and transferred to the main chamber 38 through load lock 42 via a differentially-pumped push rod (also not shown). The stage 40 is temperature controlled and can be tilted to produce angled wall profiles. An external Evenson microwave cavity 28 (a quarter-wavelength resonator tuned to oscillate at 2.45 GHz) excites and disassociates molecular chlorine flowing in a quartz tube to be discharged through the nozzle 24. The cavity 28 is sandwiched between a pair of annular Samarium Cobalt magnets 30 disposed over the inlet and outlet pipes 32, 34, respectively, to produce an axial magnetic field that confines the plasma from the quartz inner wall 36 so that the recombinatorial enhancing effect of the quartz on the radicals is minimized. The strength of the B-field produced by the magnets 30 (875 G) was chosen to achieve electron cyclotron resonance in the center of the cavity 28 in a manner well understood by those skilled in the art—although the resonance is actually highly damped in the particular geometry of the invention due to the high pressure in the nozzle 24. In the tested embodiment, the microwave cavity 28 is approximately 20 cm from the sample and the edge of the visible plasma is approximately 10 cm from the sample. The tip of the nozzle 24 is located approximately 2 cm from the stage 40. In the vicinity of the substrate 12, the nozzle 24 produces a concentrated beam 44 of excited chlorine atoms that are adsorbed to the substrate 12. The operation of the cavity 28 is controlled by the control circuitry 50 operably connected thereto.

In the preferred embodiment as built and tested, Ar+ ions in a beam 52 are produced by a Kaufman type ion gun 16' and the ion energy is controlled by non-collimated graphite grids 46 via the control circuitry 54 connected thereto. If desired, an ECR gun could be used in place of the Kaufman type ion gun 16'. The ion beam current density can also be independently controlled by the control circuitry 54 and a Faraday cup is located at 48 on the back side of the stage to monitor the ion beam current density and provide a feedback thereof for control purposes. The separate argon ion beam 52 from the ion gun 16' is combined with the chlorine to assist in the etching process. For typical conditions, the etch rate is approximately ten times higher with chlorine radicals (plasma on) than with chlorine molecules (plasma off). With chlorine radicals, the inventors observed high etch rates (2.5 μm/min) and record high sputter yields (μ150) at room temperature while maintaining relatively low ion energy (200 eV). Typical conditions during testing of the present invention in its built and tested embodiment are as follows:

| | |
|---|---|
| ion beam current density($I_b$) | = 0.2 mA/cm$^2$ |
| ion beam energy | = 200 eV |
| Cl$_2$ flow rate | = 9 sccm (impinge rate approximately 1018/cm2s) |
| chamber pressure | = 0.8 mTorr |
| microwave power | = 100 watts |
| temperature | = 30° C. |

The base pressure was below $2 \times 10^{-6}$ Torr and the samples were sputter cleaned to remove the native oxide layer prior to etching. The etch depths were measured with a Dektak mechanical stylus. In this system, various etching combinations are possible and the inventors were able to produce the full range of etching conditions from IBE (Ar+ only) to IBAE (Ar+ with Cl$_2$) to RBIBE (Ar+ with Cl*) to RBE (Cl* only). The primary emphasis of the inventors in their testing and validation of the present invention was on comparing and understanding the etching techniques of IBAE, RBIBE and RBE.

Test Results:

The etch rate was investigated as a function of chlorine flow rate as shown in FIG. 6. As expected, very high etch rates and sputter yields can be achieved with the RBIBE approach of the present invention (ion beam on, plasma on) compared to IBAE (ion beam on, plasma off). At 9 sccm, the etch rate is eight times larger for RBIBE than for IBAE. At 50 sccm, the RBIBE etch rate increases to 2.5 μm/min, which corresponds to a sputter yield of 150. These etch rates and sputter yields are especially significant considering the low ion energy used (200 eV). In the case of RBIBE, ion bombardment is only needed to desorb etch products. For IBAE on the other hand, the ion bombardment is also needed to activate the chemical reaction. This is reasonable since spontaneous etching occurs (1400 Å/min) for RBE (Cl* with no ion beam) while the etch rate is <10 Å/min for chlorine molecular etching (no ion beam and plasma off). For IBAE, the etch rate is reduced at flow rates greater than 9 sccm. It was observed that these latter samples were covered with an film residue (containing Cl$_2$) after the run was finished. This chlorine adlayer may prevent reactants from entering or reaction products from escaping, thereby causing the reduction in the etch rate. For RBIBE, on the other hand, because some of the reaction products are spontaneously desorbed and the etch rate is higher, the net incident chlorine is "used up" more quickly than for IBAE so that the etch rate can continue to increase.

Figure 7:
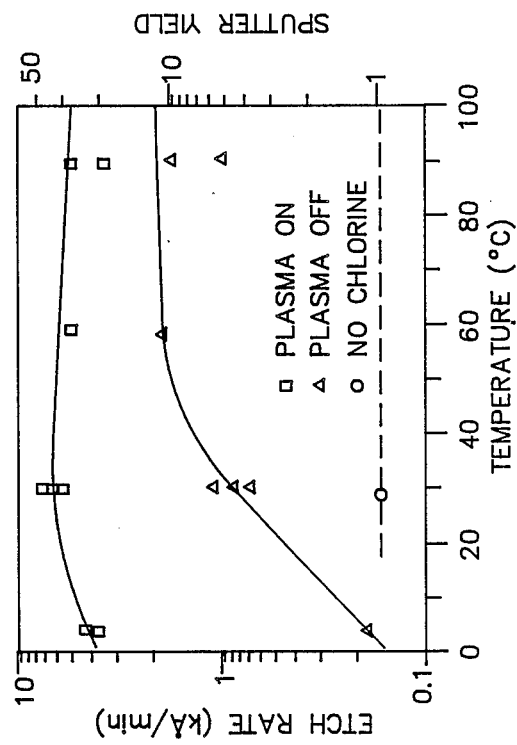
FIG. 7 is a graph of etch rate and sputter yield of IBAE (plasma off), RBIBE (plasma on) and IBE as a function of substrate temperature. The chlorine flow rate is 9 sccm. the Ar+ ion beam conditions are 0.2 mA/cm$^2$ and 200 eV.

The etch rate for RBIBE and IBAE was also measured as a function of substrate temperature as depicted in FIG. 7. For RBIBE, the etch rate varies little with temperature since "spontaneous" etching of GaAs occurs in the presence of an "activated" beam (plasma on). For IBAE, the etch rate varies an order of magnitude over the same temperature range. This difference in temperature dependence may be explained by the following. For IBAE, the etch rate may be reactant limited at low temperatures; the heated substrate facilitates the reaction by either aiding in the ion assisted "cracking" of molecular chlorine or activating the chemical reaction of the molecular chlorine with the substrate surface.

To study the transition region between IBAE and RBIBE, the microwave power was varied using control 50. The Cl* concentration inside the cavity 28 was measured using optical emission spectroscopy (OES). The intensity of the $3p^44p - 3p^44s$ (837.6 nm) transition was monitored since it has been shown to be representative of the chlorine radical emission. As the microwave power level was increased, the etch rate and line intensity were increased in the same proportion as seen in FIG. 8. The similarity of these two curves is surprisingly good considering that the emission was monitored in the vicinity of the plasma 20 cm away from the substrate. Chlorine radicals will have recombined into molecules via collisions with the walls as the radicals propagate through the nozzle 24. The samples etched at $I_b$=0.1 mA/cm$^2$ were cleaved and the cross-sections were examined. The etch time was adjusted to maintain a constant etched depth for better comparison of the wall profiles. It was found that as the power level increases from 10 to 100 watts, the chemical etching component is increased and the facet becomes less anisotropic.

In another aspect of the testing of the present invention, the etch rate and surface morphology were investigated as a function of ion beam current density ($I_b$). As seen in FIG. 9, the etch rate is 1400 Å/min for RBE (no ions) and saturates to a value of 5500 Å/min as $I_b$ is increased. For RBE at room temperature, the bottom surface was found to be rough and there were ridges in the sidewalls. At 100° C. and under the same conditions otherwise, the sample was found to have smoother surfaces and the etching appeared crystallographic, similar to wet etching. Heating the substrate may desorb non-volatile etch products which provides a smoother etched surface. The inventors herein found a critical transition in surface morphology and etch rate as the ion beam current density is varied. The bottom surface is rough for $I_b$ less than 0.02 mA/cm$^2$; but, becomes smooth for $I_b$ greater than 0.03 mA/cm$^2$. At this same beam current density (i.e. 0.03 mA/cm$^2$), the etch rate begins to saturate. This result suggests that below 0.03 mA/cm$^2$ the etching process is desorption limited and above 0.03 mA/cm$^2$ the process is reactant limited. For the RBIBE process of the present invention, the sputter yield can be increased to arbitrary large values because spontaneous etching occurs even with no ion beam. The inventors found that if the sputter yield is ~35 ($I_b$ is 0.2.mA/cm2), then the etched facet is vertical. By comparison, the prior art IBAE approach is less desirable than RBIBE from a damage standpoint because IBAE is more physical in nature, having significantly lower sputter yields (by a factor of ~5).

Thus, it can be seen from the foregoing description that the present invention has met its stated objectives by providing a novel dry etching technique and associated apparatus which offers independent control of the ion beam current flux and the chlorine radical beam flux. Rapid etching and high sputter yields (i.e. producing very low surface damage to the etched surface) can be achieved by the RBIBE technique of the present invention as compared with other well known prior art techniques. Having separate control over the ion flux and the reactive flux as is possible with the apparatus of the present invention, the etching mechanism can be made to be purely physical (IBE), purely chemical (RBE) or anywhere in between (RBIBE) as best suits the etching task being undertaken. This unique flexibility is particularly desirable for device fabrication since one can arbitrarily vary the degree of anisotropy, mask selectivity, and damage. Also, it allows novel etching sequences in which one kind of etching is followed by another. For example, RBIBE may be used to optimize etching rate and anisotropy followed by RBE to remove any residual surface damage layers. Thus, the Radical Beam/Ion Beam Etching (RBIBE) approach of the present invention should be capable of producing smooth surfaces and low damage for electronic and optoelectronic devices, and the like.

Wherefore, having thus described the present invention, what is claimed is:

1. Anisotropic chemically enhanced etching apparatus producing low surface damage and comprising:
   (a) an evacuated main chamber in which an etching process takes place;
   (b) a stage for receiving and holding a substrate to be etched within said main chamber;
   (c) duct means for directing a flow of gas radicals from an excited and disassociated reactive gas into said main chamber against a substrate to be etched mounted on said stage;
   (d) cracking means connected to a supply of a reactive gas in molecular form on an input side and connected to said duct means on an output side for exciting and disassociating said reactive gas to be discharged through said duct means as gas radicals;
   (e) ion gun means for producing a beam of ions and for directing said beam of ions against a substrate to be etched mounted on said stage; and,
   (f) first control means operably connected to said ion gun means for controlling said beam of ions.

2. The low-damage, anisotropic, chemically enhanced etching apparatus of claim 1 and additionally comprising said main chamber including:
   (a) load-locking means for suppressing residual gas contamination; and,
   (b) an associated preparation chamber for the introduction of a substrate to be etched into said main chamber.

3. The low-damage, anisotropic, chemically enhanced etching apparatus of claim 1 wherein:
   said duct means includes nozzle means positioned such that in the vicinity of the substrate being etched said nozzle means produces a concentrated stream of reactive gas radicals that can be adsorbed to said substrate.

4. The low-damage, anisotropic, chemically enhanced etching apparatus of claim 1 and additionally comprising:
   second control means operably connected to said cracking means for controlling the $\mu$W power to said cracking means and the flow of molecular reactive gas into said cracking means whereby the flow of gas radicals being emitted from said nozzle means is controlled.

5. The low-damage, anisotropic, chemically enhanced etching apparatus of claim 1 wherein said first control means comprises:
   (a) control circuit means for controlling the operating parameters of said ion gun means; and,
   (b) ion sensor means disposed within said main chamber and operably connected to said control circuit means for sensing the qualities of said beam of ions striking a substrate mounted on said stage and for providing a feedback signal reflecting those qualities to said control circuit means.

6. The low-damage, anisotropic, chemically enhanced etching apparatus of claim 1 wherein said cracking means comprises:
   a microwave cavity.

7. The low-damage, anisotropic, chemically enhanced etching apparatus of claim 6 wherein:
   (a) said microwave cavity has quartz inlet and outlet pipes connected therethrough;
   (b) said inlet pipe is connected to said supply of molecular reactive gas; and,
   (c) said microwave cavity is sandwiched between a pair of annular Samarium Cobalt magnets disposed over said inlet and outlet pipes, respectively, to produce an axial magnetic field that confines plasma from the quartz inner walls of said pipes so that the recombinatorial enhancing effect of the quartz on gas radicals passing therethrough is minimized.

8. The low-damage, anisotropic, chemically enhanced etching apparatus of claim 7 wherein additionally:
   the strength of the B-field produced by said magnets is chosen to achieve electron cyclotron resonance in the center of said microwave cavity.

9. The low-damage, anisotropic, chemically enhanced etching apparatus of claim 6 wherein:
   said microwave cavity is a quarter-wavelength resonator tuned to oscillate at 2.45 GHz.

10. The low-damage, anisotropic, chemically enhanced etching apparatus of claim 1 wherein:
    (a) said ion gun means is an ion gun wherein the ion energy produced thereby is controlled by grids contained therein which are operably connect to said first control means; and,
    (b) said ion gun means is connected to a supply of inert gas whereby said beam of ions is a beam of inert gas ions.

11. The low-damage, anisotropic, chemically enhanced etching apparatus of claim 10 wherein:
    (a) said inert gas is argon whereby said beam of ions is a beam of Ar+ ions; and,
    (b) said reactive gas is chlorine whereby molecular chlorine is excited and disassociated to be discharged through said duct means as chlorine radicals.

12. the anisotropic chemically enhanced etching apparatus of claim 1 wherein:
    (a) said ion gun means is an Electron-Cyclotron-Resonance (ECR) microwave plasma source; and,
    (b) said ion gun means is connected to a supply of inert gas whereby said beam of ions is a beam of inert gas ions.

13. The low-damage, anisotropic, chemically enhanced etching apparatus of claim 12 wherein:
(a) said inert gas is argon whereby said beam of ions is a beam of Ar+ ions; and,
(b) said reactive gas is chlorine whereby molecular chlorine is excited and disassociated to be discharged through said duct means as chlorine radicals.

14. The anisotropic chemically enhanced etching apparatus of claim 2 wherein:
said stage is temperature controlled, tiltable, and movable between said preparation chamber means and said main chamber.

15. Anisotropic chemically enhanced etching apparatus producing low surface damage and comprising:
(a) an evacuated main chamber in which an etching process takes place;
(b) a stage for receiving and holding a substrate to be etched within said main chamber;
(c) nozzle means for directing a flow of chlorine radicals from excited and disassociated chlorine into said main chamber and against a substrate to be etched mounted on said stage;
(d) cracking means connected to a supply of molecular chlorine on an input side and connected to said nozzle means on an output side for exciting and disassociating said molecular chlorine to be discharged through said nozzle means, said nozzle means being positioned such that in the vicinity of the substrate being etched said nozzle means produces a concentrated stream of chlorine radicals that can be adsorbed to said substrate;
(e) first control means operably connected to said cracking means for controlling the flow of chlorine radicals being emitted from said nozzle means;
(f) ion gun means for producing a beam of ions and for directing said beam of ions against a substrate to be etched mounted on said stage; and,
(g) second control means operably connected to said ion gun means for controlling said beam of ions.

16. the low damage-producing, anisotropic, chemically enhanced etching apparatus of claim 15 wherein:
said first control means includes means for controlling the flow of chlorine radicals being emitted from said nozzle means by controlling the $\mu$W power to said cracking means and the flow of molecular chlorine into said cracking means.

17. The low damage-producing, anisotropic, chemically enhanced etching apparatus of claim 15 wherein:
said main chamber includes load-locking means for suppressing residual gas contamination and an associated preparation chamber for the introduction of a substrate to be etched into said main chamber.

18. The low damage-producing, anisotropic, chemically enhanced etching apparatus of claim 15 wherein said second control means comprises:
(a) control circuit means for controlling the operating parameters of said ion gun means; and,
(b) ion sensor means disposed within said main chamber and operably connected to said control circuit means for sensing the qualities of said beam of ions striking a substrate mounted on said stage and for providing a feedback signal reflecting those qualities to said control circuit means.

19. The low damage-producing, anisotropic, chemically enhanced etching apparatus of claim 15 wherein said cracking means comprises:
a microwave cavity.

20. the low damage-producing, anisotropic, chemically enhanced etching apparatus of claim 19 wherein:
(a) said microwave cavity has quartz inlet and outlet pipes connected therethrough;
(b) said inlet pipe is connected to said supply of molecular chlorine; and,
(c) said microwave cavity is sandwiched between a pair of annular Samarium Cobalt magnets disposed over said inlet and outlet pipes, respectively, to produce an axial magnetic field that confines plasma from the quartz inner walls of said pipes so that the recombinatorial enhancing effect of the quartz on chlorine radicals passing therethrough is minimized.

21. the low damage-producing, anisotropic, chemically enhanced etching apparatus of claim 20 wherein additionally:
the strength of the B-field produced by said magnets is chosen to achieve cyclotron resonance in the center of said microwave cavity.

22. The low damage-producing, anisotropic, chemically enhanced etching apparatus of claim 19 wherein:
said microwave cavity is a quarter-wavelength resonator tuned to oscillate at 2.45 GHz.

23. The low damage-producing, anisotropic, chemically enhanced etching apparatus of claim 15 wherein:
(a) said ion gun means is an ion gun wherein the ion energy produced thereby is controlled by grids contained therein which are operably connect to said first control means; and,
(b) said ion gun means is connected to a supply of inert gas whereby said beam of ions is a beam of ions of said inert gas.

24. The low damage-producing, anisotropic, chemically enhanced etching apparatus of claim 23 wherein:
said inert gas is Argon whereby said beam of ions is a beam of Ar+ ions.

25. The low damage-producing, anisotropic, chemically enhanced etching apparatus of claim 15 wherein:
(a) said ion gun means is an Electron-Cyclotron-Resonance (ECR) microwave plasma source; and,
(b) said ion gun means is connected to a supply of argon gas whereby said beam of ions is a beam of Ar+ ions.

26. The low damage-producing, anisotropic, chemically enhanced etching apparatus of claim 17 wherein:
said stage is temperature controlled, tiltable, and movable between said preparation chamber means and said main chamber.

27. Low damage-producing, anisotropic, chemically enhanced etchng apparatus comprising:
(a) an evacuated main chamber in which an etching process takes place including load-locking means for suppressing residual gas contamination and an associated preparation chamber for the introduction of a substrate to be etched into said main chamber;
(b) a temperature controlled tiltable stage for receiving and holding a substrate to be etched, said stage being movable between said preparation chamber means and said main chamber;
(c) nozzle means for directing a flow of chlorine radicals from excited and disassociated chlorine against a substrate to be etched mounted on said tiltable stage when said stage is located in said main chamber;
(d) microwave cavity cracking means having quartz inlet and outlet pipes connected to an internal microwave cavity with said inlet pipe being connected to a supply of molecular chlorine and said outlet pipe being connected to said nozzle means for selectively exciting and disassociating said molecular chlorine to be discharged through said nozzle means, said nozzle means being positioned to produce a stream of chlorine radicals that can be adsorbed to said substrate;

(e) a pair of annular Samarium Cobalt magnets disposed over said inlet and outlet pipes, respectively, to produce an axial magnetic field that confines plasma from the quartz inner walls of said pipes so that the recombinatorial enhancing effort of the quartz on chlorine radicals passing therethrough is minimized.

(f) first control means operably connected to said microwave cavity cracking means for controlling the flow of chlorine radicals being emitted from said nozzle means by controlling the $\mu$W power to said microwave cavity cracking means and the flow of molecular chlorine into said microwave cavity cracking means;

(g) ion gun means for producing a beam of ions and for directing said beam of ions against a substrate to be etched mounted on said tiltable stage; and, (h) second control means operably connected to said ion gun means for controlling said beam of ions, said second control means comprising, (h1) control circuit means for controlling the operating parameters of said ion gun means; and, (h2) ion sensor means disposed within said main chamber and operably connected to said control circuit means for sensing the qualities of said beam of ions striking a substrate mounted on said stage and for providing a feedback signal reflecting those qualities to said control circuit means.

28. The low damage-producing, anisotropic, chemically enhanced etching apparatus of claim 27 wherein additionally:
the strength of the B-field produced by said magnets is chosen to achieve electron cyclotron resonance in the center of said microwave cavity.

29. The low damage-producing, anisotropic, chemically enhanced etching apparatus of claim 27 wherein:
said microwave cavity is a quarter-wavelength resonator tuned to oscillate at 2.45 GHz.

30. The low damage-producing, anisotropic, chemically enhanced etching apparatus of claim 27 wherein:
(a) said ion gun means is an ion gun wherein the ion energy produced thereby is controlled by grids contained therein which are operably connect to said first control means; and,
(b) said ion gun means is connected to a supply of argon gas whereby said beam of ions is a beam of $Ar^+$ ions.

31. The low damage-producing, anisotropic, chemically enhanced etching apparatus of claim 27 wherein:
(a) said ion gun means is an Electron-Cyclotron-Resonance (ECR) microwave plasma source; and,
(b) said ion gun means is connected to a supply of argon gas whereby said beam of ions is a beam of $Ar^+$ ions.

32. The method of operating low damage-producing, anisotropic, chemically enhanced etching apparatus comprising the steps of:
(a) providing an evacuated chamber into which a substrate to be etched can be placed;

(b) providing a temperature controlled tiltable stage in the chamber for receiving and holding the substrate at a proper angle for etching;

(c) connecting an input into a microwave cavity to a supply of molecular chlorine for selectively exciting and disassociating molecular chlorine;

(d) connecting an outlet from the microwave cavity to be conducted and discharged close adjacent and against the stage;

(c) connecting first control means to the microwave cavity for controlling the flow of excited chlorine radicals being emitted from the microwave cavity;

(f) providing an ion gun producing a beam of $Ar^+$ ions and directing the beam of ions against the position of a substrate to be etched mounted on the stage;

(g) connecting second control means to the ion gun to control the beam of ions;

(h) placing a substrate to be etched into the evacuated chamber on the stage receiving at a desired angle for etching; and, (i) using the first and second control means to control the amount of excited chlorine radicals and $Ar^+$ ions impinging on the substrate.

33. The method of claim 32 wherein said step (g) of connecting second control means to the ion gun to control the beam of ions comprises the step of:
(a) providing a control circuit for controlling the operating parameters of the ion gun; and,
(b) providing an ion sensor disposed within the chamber and operably connected to the control circuit for sensing the qualities of the beam of ions striking a substrate mounted on the stage and for providing a feedback signal reflecting those qualities to the control circuit.

34. The method of claim 32 wherein the microwave cavity has quartz inlet and outlet pipes and additionally comprising the step of:
disposing a pair of annular Samarium Cobalt magnets over the inlet and outlet pipes, respectively, to produce an axial magnetic field that confines plasma from the quartz inner walls of the pipes so that the recombinatorial enhancing effect of the quartz on chlorine radicals passing therethrough is minimized.

35. The method of claim 34 wherein the step of disposing a pair of annular Samarium Cobalt magnets over the inlet and outlet pipes includes the step of:
choosing magnets such that the strength of the B-field produced by the magnets achieves electron cyclotron resonance in the center of the microwave cavity.

36. The method of claim 32 wherein the microwave cavity is a quarterwavelength resonator and additionally comprising the step of:
tuning the cavity to oscillate at 2.45 GHz.

37. The method of claim 32 wherein the ion gun means is an ion gun wherein the ion energy produced thereby is controlled by grids contained therein and said step (g) of connecting second control means to the ion gun to control the beam of ions comprises the step of:
connecting a control circuit to the grids.

38. The method of claim 32 and additionally comprising the step of:
connecting a nozzle between the outlet from the microwave cavity and a point close adjacent the stage to concentrate a flow of chlorine radicals emerging therefrom against a sustrate being held by said stage.

39. In anisotropic chemically enhanced etching apparatus including an evacuated main chamber in which an etching process takes place, a stage for receiving and holding a substrate to be etched within the main chamber, and a duct for directing a flow of gas radicals from an excited and disassociated reactive gas into the main chamber against a substrate to be etched mounted on the stage, the method of operation to etch a substrate while producing low surface damage comprising the steps of:

(a) mounting a substrate to be etched on the stage;

(b) connecting microwave cracking means to a supply of a reactive gas in molecular form on an input side and connecting an output side to the duct so as to excite and disassociate the reactive gas and discharge it through the duct as reactive gas radicals;

(c) connecting an ion gun to a supply of an inert gas on an input side so as to produce a beam of inert gas ions; and, (d) directing the beam of inert gas ions against the substrate.

40. the method of claim 39 and additionally comprising the steps of:

(a) controlling the $\mu W$ power to the microwave cracking means;

(b) controlling the flow rate of the reactive gas in molecular form into the input side of $\mu$ the microwave cracking means; and, (c) controlling the inert gas ion beam by means of a control signal operably connected to control grids contained in the ion gun.

* * * * *